US006847539B2

(12) United States Patent
Aoki

(10) Patent No.: US 6,847,539 B2
(45) Date of Patent: Jan. 25, 2005

(54) FERROELECTRIC MEMORY AND METHOD OF READING DATA IN THE SAME

(75) Inventor: Masaki Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/716,705

(22) Filed: Nov. 20, 2003

(65) Prior Publication Data

US 2004/0114418 A1 Jun. 17, 2004

(30) Foreign Application Priority Data

Nov. 25, 2002 (JP) ........................................ 2002-340990

(51) Int. Cl.[7] .............................................. G11C 11/22
(52) U.S. Cl. ................ 365/145; 365/185.2; 365/185.08
(58) Field of Search ................................ 365/145, 149, 365/210, 185.2, 185.21, 189.01, 189.08

(56) References Cited

U.S. PATENT DOCUMENTS 6,128,213 A * 10/2000 Kang .......................... 365/145
6,370,056 B1 * 4/2002 Chen et al. .................. 365/145
6,370,058 B1 * 4/2002 Fukumoto .............. 365/185.08

FOREIGN PATENT DOCUMENTS

JP 2001-234761 9/2001

* cited by examiner

Primary Examiner—Gene N. Auduong
(74) Attorney, Agent, or Firm—Arent Fox PLLC

(57) ABSTRACT

Prior to the first read operation for reading data from real memory cells, the second read operation for reading data from dummy memory cells is carried out using reference memory cells. A reduced residual dielectric polarization values of ferroelectric capacitors of the reference memory cells due to heat treatment and the like in manufacturing process, is recovered by the second read operation to an original value before the read access to the real memory cells. Therefore, data in the real memory cells is properly read out in the subsequent first read operation. As a result, it is possible to certainly read data from a ROM area in a ferroelectric memory to which data is written in advance in a test process of the manufacturing process, for example.

13 Claims, 12 Drawing Sheets

FERROELECTRIC MEMORY AND METHOD OF READING DATA IN THE SAME

CROSS REFERENCE TO RELATED APPLICATION

This application is based upon and claims the benefit of priority from the prior Japanese Patent Application No. 2002-340990, filed on Nov. 25, 2002, the entire contents of which are incorporated herein by reference.

BACKGROUND OF THE INVENTION

1. Field of the Invention

The present invention relates to a ferroelectric memory including a ROM area which is composed of ferroelectric memory cells, and a method of reading data in the ferroelectric memory.

2. Description of the Related Art

A ferroelectric memory composed of memory cells each including a ferroelectric capacitor is developed as a semiconductor memory device which has both advantages of DRAMs and flash memories and EEPROMs. The ferroelectric memory operates the ferroelectric capacitor as a variable capacitor. The ferroelectric memory can hold data without supplied with voltage, by utilizing residual dielectric polarization which is left even when no voltage is applied to the ferroelectric capacitor.

The supply voltage (operating voltage) of the ferroelectric memory has been decreasing due to finer transistor structure, reduction in power consumption and the like. This often causes deterioration in data write characteristic to the ferroelectric capacitor and reduction in a read margin. Specifically, a hysteresis loop indicating the data write characteristic is smaller in size as write voltage decreases, resulting in lessening an amount of electric charge generated from variations in polarization charge during read operation.

Recently, there has been developed an IC card with security function incorporating the ferroelectric memory. The ferroelectric memory mounted on this type of the IC card has a ROM area as a part of memory cell area. The ROM area stores therein key data used in Public Key Infrastructure (PKI). A manufacturer of the ferroelectric memory writes key data into the ROM area (disclosed in, for example, Japanese Unexamined Patent Application Publication No. 2001-243761). Writing key data into the ROM area of the ferroelectric memory in the manufacturing process makes it possible to, for example, identify a user of the IC card with high reliability.

Generally, for mounting the ferroelectric memory on the IC card, a ferroelectric memory chip is soldered to a printed-wiring board of the IC card. In case of soldering with infrared reflow, the ferroelectric memory is temporarily subjected to heat of approximately 230° C. Since the hysteresis characteristic of the ferroelectric memory has temperature dependency, the higher the temperature of the ferroelectric capacitor becomes, the smaller the hysteresis loop becomes (the depolarization of the ferroelectric capacitor). Therefore, even when key data is written into the ROM area to generate substantial residual dielectric polarization, a residual dielectric a polarization value is reduced by a subsequent soldering processing (heat treatment), so that the read margin decreases. In other words, written data is lost. This problem becomes more serious as the operating voltage decreases (the write voltage decreases).

SUMMARY OF THE INVENTION

An object of the present invention is to read data from a ferroelectric memory cell with sureness even when a read margin of data written in manufacturing process decreases in a subsequent heating process.

According to one of the aspects of the present invention, a ferroelectric memory has a ROM area and a RAM area both of which are composed of memory cells having a ferroelectric capacitor. The ROM area has at least one real memory cell, a dummy memory cell, a reference memory cell, a first bit line, a second bit line, and a sense amplifier. The real memory cell stores therein data to be written in manufacturing process of the ferroelectric memory. In the reference memory cell, the residual dielectric polarization value of the ferroelectric capacitor is set to a predetermined value in the manufacturing process. In the ferroelectric memory, for example, a second read operation for reading dummy data from the dummy memory cell is carried out before a first read operation for reading real data from the real memory cell.

In the second read operation, an electric charge corresponding to the residual dielectric polarization value of the ferroelectric capacitor in the dummy memory cell is transferred to the first bit line. The reference memory cell is accessed in synchronization with the dummy memory cell, and an electric charge corresponding to the residual dielectric polarization value of the ferroelectric capacitor of the reference memory cell is transferred to the second bit line. The sense amplifier amplifies a difference in voltage between the first and second bit lines occurring due to the electric charges transferred to the first and second bit lines.

Accessing the reference memory cell by the read access to the dummy memory before the read access to the real memory cell enables a reduced residual dielectric polarization value of the ferroelectric capacitor of the reference memory cell due to heat treatment and the like in the manufacturing process, to be recovered to an original value.

In the first read operation after the second read operation, an electric charge corresponding to the residual dielectric polarization value of the ferroelectric capacitor in the real memory cell is transferred to the first bit line. The reference memory cell is accessed in synchronization with the real memory cell, and an electric charge corresponding to the residual dielectric polarization value of the ferroelectric capacitor of the reference memory cell is transferred to the second bit line. The sense amplifier amplifies a difference in voltage between the first and second bit lines occurring due to the electric charges transferred to the first and second bit lines.

The residual dielectric polarization value of the ferroelectric capacitor of the reference memory cell is recovered to a normal value by the second read operation. Therefore, data can be properly read from the real memory cell. As a result, it is possible to reliably read data from the ROM area in the ferroelectric memory to which data is written in advance in test process of the manufacturing process, for example.

According to another aspect of the present invention, the RAM area has a normal memory cell for reading data therefrom and writing data thereto, and a reference memory cell used in accessing the normal memory cell. The size of the ferroelectric capacitor of the reference memory cell in the ROM area is larger than that of the ferroelectric capacitor of the reference memory cell in the RAM area. Generally, enlarging the size of the ferroelectric capacitor increases an amount of electric charge (the residual dielectric polarization value) generated in read operation. Thus, it is able to minimize the influence of the depolarization in the reference memory cell in the ROM area due to the heat treatment and the like in the manufacturing process. As a result, proper data can always be read from the real memory cell in the ROM area.

According to another aspect of the present invention, data written into the real memory cell in advance is authentication data. Even in a case where the residual dielectric polarization value of the ferroelectric capacitor of the reference memory cell has reduced due to the heat treatment and the like as described above, the reduced residual dielectric polarization value can be recovered to a normal value by the read access to the dummy memory cell. Therefore, even with authentication data written into the ROM area in the manufacturing process, it is possible to read the authentication data with sureness. As a result, adopting the present invention makes it possible to add security function to the ferroelectric memory with ease. A single ferroelectric memory can function as both of the ROM storing authentication data, and the RAM storing other data. Therefore, it is possible to realize an IC card and the like with the security function at low cost.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
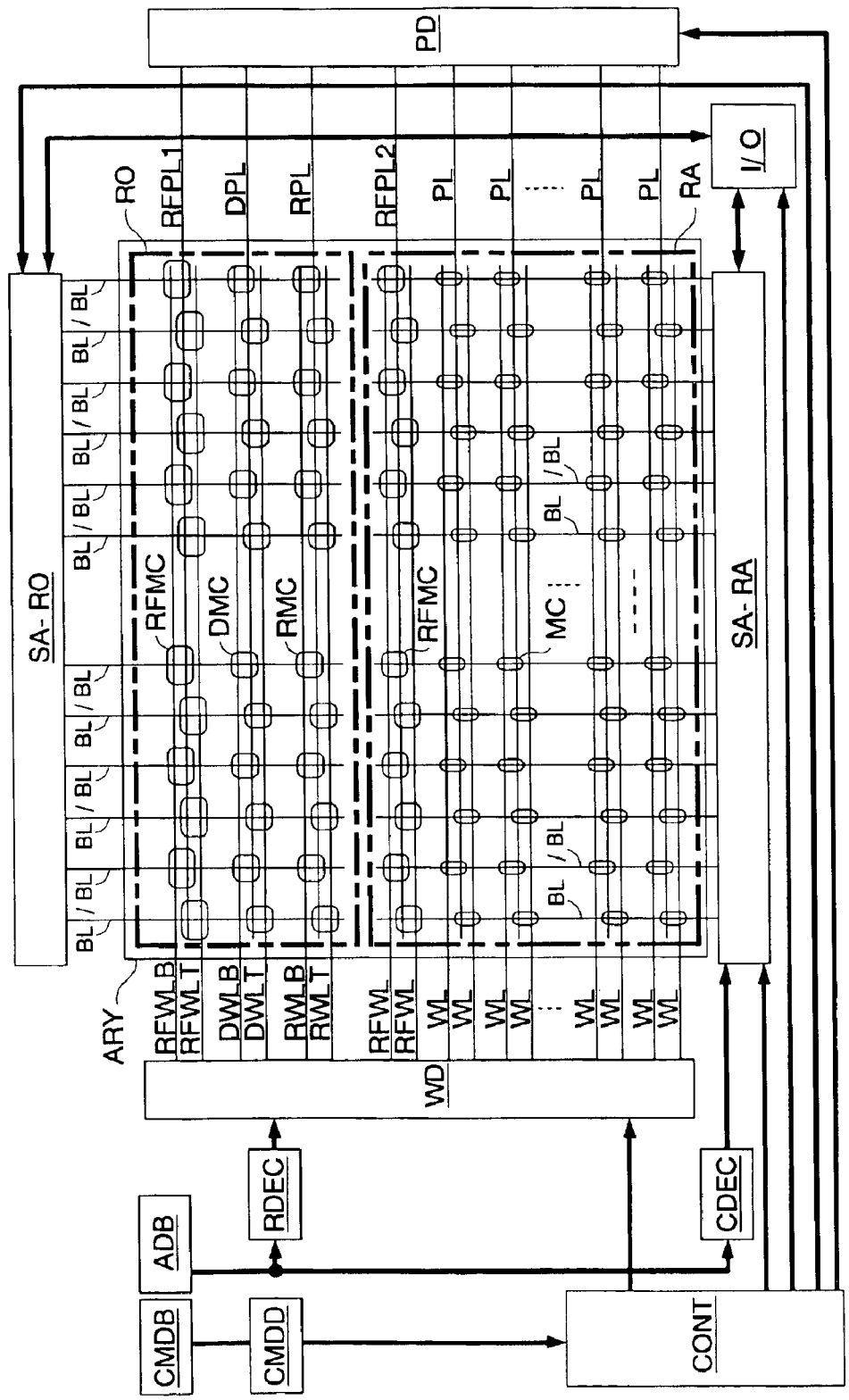
FIG. 1 is a block diagram showing a first embodiment of the present invention.

Embodiments of the present invention will be hereinafter described with reference to drawings. In the drawings, thick lines are signal lines composed of a plurality of bits.

FIG. 1 shows a first embodiment of a ferroelectric memory and a method of reading data in the ferroelectric memory according to the present invention.

The ferroelectric memory is formed on a silicon substrate with the use of CMOS process. The ferroelectric memory mounted on, for example, an IC card is used as a security chip. To use the ferroelectric memory as the security chip, authentication data is written thereinto in a test process of manufacturing process. Pads formed in the ferroelectric memory chip are soldered to the printed-wiring board of the IC card and the like, so that the ferroelectric memory chip is mounted on the IC card. Soldering is carried out with, for example, infrared reflow.

The ferroelectric memory has a command buffer CMDB, a command decoder CMDD, an address buffer ADB, a control circuit CONT, a row decoder RDEC, a column decoder CDEC, a word driver row WD, a memory cell array ARY, sense amplifier rows SA-RO and SA-RA, a plate driver row PD, and a data input/output circuit I/O.

The command buffer CMDB receives command signals such as a write enable signal and the like via an external terminal, and outputs the received signals to the command decoder CMDD. The address buffer ADB receives an address signal via an external terminal, and outputs the received signal to the row decoder RDEC and the column decoder CDEC.

The command decoder CMDD decodes the command signal and outputs the decoding results to the control circuit CONT. The control circuit CONT generates control signals which operate the plate driver row PD, the word driver row WD, the sense amplifier rows SA-RO and SA-RA, and the data input/output circuit I/O. The row decoder RDEC decodes higher order bits of the address signal (row address) to generate a decode signal, and outputs the generated signal to the word driver row WD. The column decoder CDEC decodes lower order bits of the address signal (column address) to generate a decode signal, and outputs the generated signal to the column decoder row CDEC.

The word driver row WD has a plurality of word drivers. The word driver row WD changes word lines WLs (RFWLB, RFWLT, DWLB, DWLT, RWLB, RWLT, and RFWL) to high voltage or ground voltage, in accordance with the control signal from the control circuit CONT and the decode signal from the row decoder RDEC.

The plate driver row PD has a plurality of plate drivers. The plate driver row PD changes plate lines PLs (RFPL1, DPL, RPL and RFPL2) to plate voltage or ground voltage, in accordance with the control signal from the control circuit CONT.

The sense amplifier row SA-RO is connected to a ROM area described later, through pairs of bit lines BLs and /BLs (complementary bit lines). The sense amplifier row SA-RO has a plurality of sense amplifiers and a plurality of column switches connected to the bit line pairs BLs and /BLs. Each of the sense amplifiers amplifies a difference in voltage between the bit lines BL and /BL occurring in accordance with the residual dielectric polarization value of the ferroelectric capacitor, during read operation. A predetermined number of column switches are turned on in response to the decode signal outputted from the column decoder CDEC to output as read data a part of data amplified by the sense amplifiers in the sense amplifier row SA-RO to the data input/output circuit I/O. The column switches, for example, select eight sense amplifiers (16 bit lines BLs and /BLs) from the 256 sense amplifiers arranged in the sense amplifier row SA-RO, in accordance with a column address. Read data of eight bits amplified by the sense amplifiers are outputted to the data input/output circuit I/O.

The sense amplifier row SA-RA is connected to a RAM area described later, through pairs of bit lines BLs and /BLs. The sense amplifier row SA-RA has a plurality of sense amplifiers and a plurality of column switch connected to the bit line pairs BLs and /BLs. The sense amplifiers and the column switches are identical to those in the sense amplifier row SA-RO.

The memory cell array ARY has the ROM area RO (an area surrounded by dashed lines in the drawing), and the RAM area RA (an area surrounded by chain double dashed lines in the drawing).

The ROM area RO is constructed of real memory cells RMCs, dummy memory cells DMCs, and reference memory cells RFMCs each having a ferroelectric capacitor. The real memory cell RMC is disposed at the intersection point between the word line RWLT (the first word line) and the bit line BL, or between the word line RWLB (the first word line) and the bit line /BL. The dummy memory cell DMC is disposed at the intersection point between the word line DWLT (the second word line) and the bit line BL, or between the word line DWLB (the second word line) and the bit line /BL. The reference memory cell RFMC is disposed at the intersection point between the word line RFWLT (the third word line) and the bit line BL, or between the word line RFWLB (the third word line) and the bit line /BL. In the ROM area RO, the memory cells connected to the word lines ending in "T" are connected to the bit line BL, and the memory cells connected to the word lines ending in "B" are connected to the bit line /BL.

The real memory cells RMCs are connected to a plate line RPL (the first plate line). The dummy memory cells DMCs are connected to a plate line DPL (the second plate line). The reference memory cells RFMCs are connected to a plate line RFPL1 (the third plate line).

For example, key data (a kind of authentication data used in the security chip) used in the Public Key Infrastructure is written into the real memory cells RMCs during the test process of the ferroelectric memory manufacturing. After the test process, the word lines RWLB and RWLT connected to the real memory cells RMCs are selected only in the read operation. The numbers of the reference memory cells RFMC, the dummy memory cells DMC, and the real memory cells RMC are all 512. Therefore, the ROM area RO can store key data of 512 bits therein.

The dummy memory cells DMCs are used for dummy read before data read from the real memory cells RMCs. Accordingly, data stored in the dummy memory cells DMCs can be logic "1" or "0".

The RAM area RA are constructed of the reference memory cells RFMCs each having a ferroelectric capacitor, and memory cells MCs used in usual read and write operation. The reference memory cell RFMC is identical to that of the ROM area RO. The memory cell MC is identical to the real memory cell RMC and the dummy memory cell DMC of the ROM area RO. The RAM area RA is almost identical to the ROM area RO except that storage capacity thereof is larger than that of ROM area RO, and it does not include dummy memory cells DMCs. The reference memory cells RFMCs of the RAM area RA are connected to the word line RFWL and the plate line RFPL2. The memory cells MCs are connected to the word line WL and the plate line PL.

In the ROM area RO, the word lines RWLT, RWLB, DWLT, DWLB, RFWLT, and RFWLB and the plate lines RPL, DPL, and RFPL1 are wired in a horizontal direction in the drawing. In the RAM area RA, as with the ROM area RO, the word lines WLs and RFWLs, and the plate lines PLs and RFPL2 are wired in the horizontal direction in the drawing. Namely, the ferroelectric memory according to this embodiment adopts a word line/plate line parallel technique. According to the word line/plate line parallel technique, a single plate line is selected in response to the selection of one of the word lines. Therefore, the operation control of the plate driver row PD is simplified.

The size of the ferroelectric capacitor of the reference memory cell RFMC in the ROM area RO is twice as large as that of the ferroelectric capacitor of the reference memory cell RFMC in the RAM area RA. Likewise, the size of the ferroelectric capacitor of the real memory cell RMC in the ROM area RO is twice as large as that of the ferroelectric capacitor of the normal memory cell MC in the RAM area RA. Generally, enlarging the size of the ferroelectric capacitor leads to increasing an amount of electric charge (a residual dielectric polarization value) generated during read operation. Thus, forming a larger ferroelectric capacitor in size in the ROM area RO than in the RAM area RA can improve the read margin of data from the ROM area RO.

In the ROM area RO, the size of the ferroelectric capacitor in the reference memory cell RFMC is 1.5 times as large as that of the ferroelectric capacitor in the dummy memory cell DMC or the real memory cell RMC. In the RAM area RA, the size of the ferroelectric capacitor in the reference memory cell RFMC is 1.5 times as large as that of the ferroelectric capacitor in the normal memory cell MC.

The data input/output circuit I/O outputs read data from the sense amplifier rows SA-RO and SA-RA via a data terminal to the outside, or outputs write data from the outside to the sense amplifier row SA-RA, in response to the control signal from the control circuit CONT. The data terminals (not illustrated) are composed of eight bits, for example.

Figure 2:
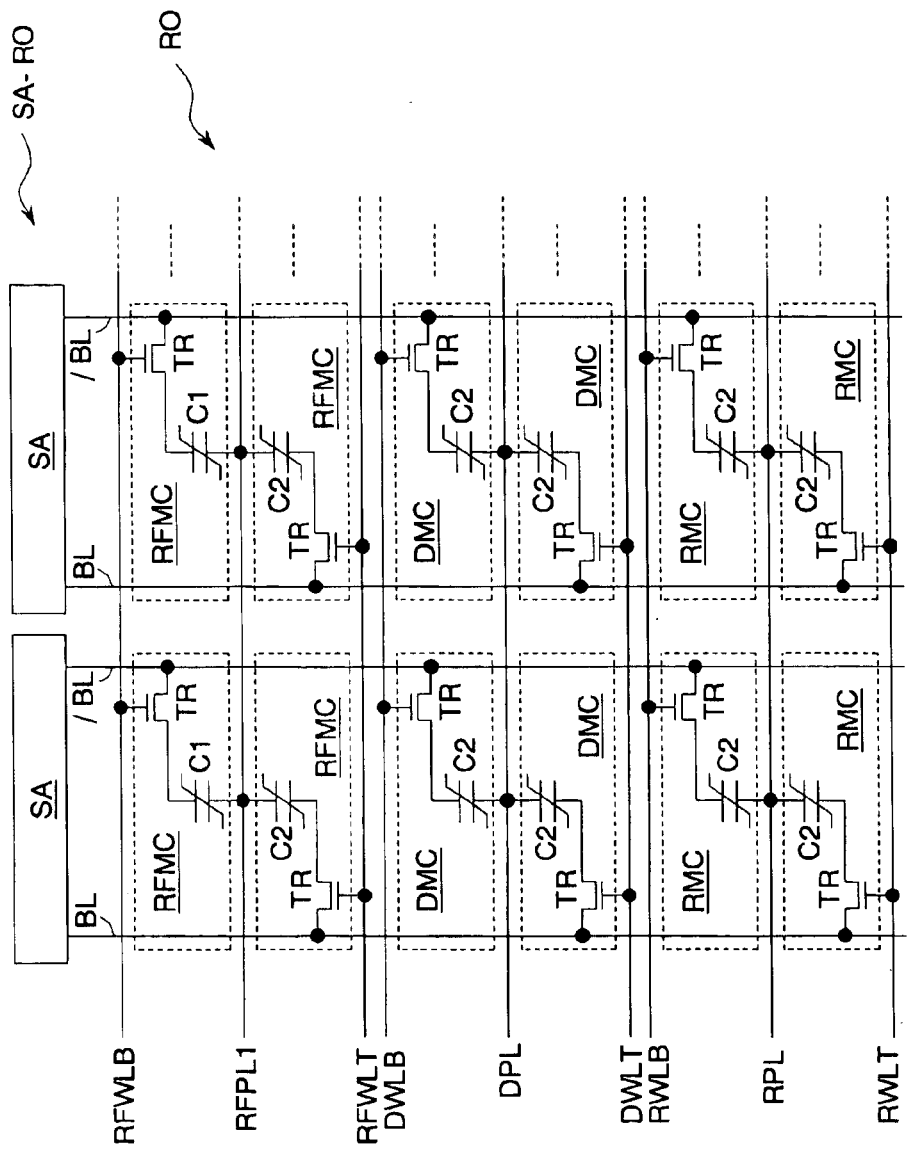
FIG. 2 is a block diagram showing the details of essential portions of a ROM area RO shown in FIG. 1.

FIG. 2 shows the details of the essential portions of the ROM area RO in FIG. 1.

The reference memory cell RFMC has a transfer transistor TR and a ferroelectric capacitor C1. The transfer transistor TR is connected to the bit line BL or /BL at one of its source and drain, and is connected to one end of the ferroelectric capacitor C1 at the other one of the source and drain. The gate of the transfer transistor TR is connected to the word line RFWLB or RFWLT. The other end of the ferroelectric capacitor C1 of the reference memory cell RFMC is connected to the plate line RFPL1 which is common to all the reference memory cells RFMCs.

Each of the dummy memory cell DMC and the real memory cell RMC has a transfer transistor TR and a ferroelectric capacitor C2. The transfer transistors TR in the dummy memory cell DMC and the real memory cell RMC are connected to the bit line BL or /BL at one of their sources and drains, and connected to one end of the ferroelectric capacitor C2 at the other one of their sources and drains. The gate of the transfer transistor TR is connected to one of the word lines DWLB, DWLT, RWLB, and RWLT. The other end of the ferroelectric capacitor C2 of the dummy memory cell DMC is connected to the plate line DPL which is common to all the dummy memory cells DMCs. The other end of the ferroelectric capacitor C2 of the real memory cell RMC is connected to the plate line RPL which is common to all the real memory cells RMCs.

The size of the ferroelectric capacitor C1 in the reference memory cell RFMC is, as described above, 1.5 times as large as that of the ferroelectric capacitor C2 in the dummy memory cell DMC and the real memory cell RMC. Therefore, the capacitance of the ferroelectric capacitor C1 in the reference memory cell RFMC is 1.5 times as large as that of the ferroelectric capacitor C2 in the dummy memory cell DMC and the real memory cell RMC. The residual dielectric polarization value of the ferroelectric capacitor C1 in the reference memory cell RFMC is set to a predetermined value during the test process of the ferroelectric memory manufacturing.

Next, the read operation on the real memory cells RMCs will be hereinafter described.

In the read operation on the real memory cells RMCs connected to the bit lines BLs, the word line RFWLB connected to the reference memory cells RFMCs is selected in synchronization with the selection of the word line RWLT ending in "T". The ferroelectric capacitors C2 of the real memory cells RMCs are connected to the bit lines BLs, and the ferroelectric capacitors C1 of the reference memory cells RFMCs are connected to the bit lines /BLs. The bit lines BLs and /BLs are pre-charged with predetermined voltages before the read operation.

High-level pulses are inputted into the plate lines RPL and RFPL1 in synchronization with the selection of the word lines RWLT and the RFWLB. Am electric charge, an amount of which corresponds to the residual dielectric polarization value of the ferroelectric capacitor C2 in the real memory cell RMC, is transferred to the bit line BL (the first bit line). An electric charge, an amount of which corresponds to the residual dielectric polarization value of the ferroelectric capacitor C1 in the reference memory cell RFMC, is transferred to the bit line /BL (the second bit line). The voltages of the bit lines BL and /BL vary in accordance with the residual dielectric polarization values of the ferroelectric capacitors C2 and C1, respectively. Then, the sense amplifier SA amplifies the difference in the voltages between the bit lines BL and /BL, and data stored in the real memory cell RMC is read out.

Likewise, In the read operation on the real memory cells RMCs connected to the bit lines /BLs, the word line RFWLT connected to the reference memory cells RFMCs is selected in synchronization with the selection of the word line RWLB ending in "B". The ferroelectric capacitors C2 of real memory cells RMCs are connected to the bit lines /BLs, and the ferroelectric capacitors C1 of the reference memory cells RFMCs are connected to the bit lines BLs. High-level pulses are inputted into the plate lines RPL and RFPL1 in synchronization with the selection of the word lines RWLB and the RFWLT. The voltage of the bit line /BL (the first bit line) varies in accordance with the residual dielectric polarization value of the ferroelectric capacitor C2 in the real memory cell RMC. The voltage of the bit line BL (the second bit line) varies in accordance with the residual dielectric polarization value of the ferroelectric capacitor C1 in the reference memory cell RFMC. Then, the sense amplifier SA amplifies the difference in the voltages between the bit lines BL and /BL, and data stored in the real memory cell RMC is read out.

Meanwhile, the read operation on the dummy memory cells DMCs (the second read operation) is carried out after the power-on of the ferroelectric memory (activation of power source) and before the read operation on the real memory cells RMCs (the first read operation). As is the case with the read operation on the real memory cells RMCs described above, the read operation on the dummy memory cells DMCs connected to the bit lines BLs is carried out by selecting the reference memory cells RFMCs connected to the bit lines /BLs. The read operation on the dummy memory cells DMCs connected to the bit lines /BLs is carried out by selecting the reference memory cells RFMCs connected to the bit lines BLs.

Figure 3:
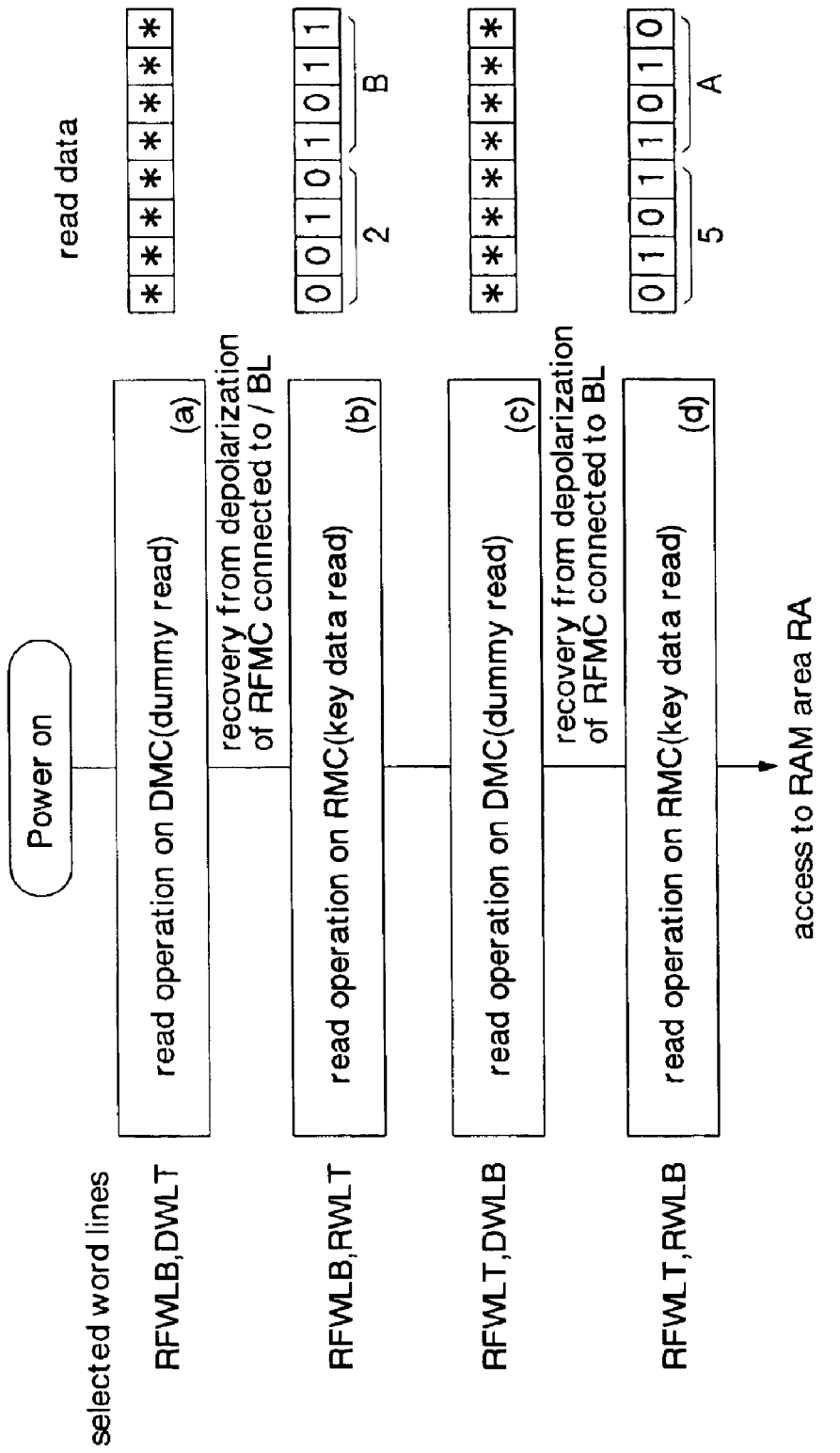
FIG. 3 is a flow chart showing the operation of a ferroelectric memory according to the first embodiment.

FIG. 3 shows the operation of the ferroelectric memory according to the first embodiment.

The flow chart shows steps of reading key data stored in the ROM area RO. These steps are included in an initial operation to be carried out first after the ferroelectric memory is supplied with a voltage (after power-on). A system on which the ferroelectric memory is mounted (a control chip or a control core such as CPU and the like) has to access the ferroelectric memory for key data readout, following the flow chart shown in FIG. 3.

In the ferroelectric memory, as described above, key data is written into the real memory cells RMCs, and the residual dielectric polarization values of the ferroelectric capacitors in the reference memory cells RFMCs are set to the predetermined values, in the test process of the manufacturing process. In assembly process of mounting the ferroelectric memory on the IC card, the infrared reflow is carried out. The ferroelectric memory chip is temporarily subjected to heat of approximately 230° C. through the infrared reflow. The heat decreases the residual dielectric polarization value of the ferroelectric capacitor (depolarization), so that the read margin also decreases.

In a case that a user (system) uses the ferroelectric memory as a RAM, or uses the ferroelectric memory as a ROM after writing data therein, the decrease in the read margin due to the heat treatment in the assembly process does not cause any problem. This is because the depolarized residual dielectric polarization value recovers to a normal value owing to the data write. To the contrary, in a case where the manufacturer ships the ferroelectric memory with written data in the test process, the decrease in the read margin due to the depolarization in the test process may cause malfunction in the read operation. Successively executing the first read operation after power-on following the flow to be described below, however, makes it possible to lessen the decrease in the read margin of key data.

First, the system on which the ferroelectric memory is mounted selects the word lines RFWLB and DWLT to carry out the read operation (the dummy read) on the dummy memory cells DMCs connected to the bit lines BLs after power-on (refer to (a) of FIG. 3). In other words, the second read operation is carried out to read 8-bit undefined data ("*" in the drawing). The second read operation is carried out as the first read operation after power-on. The residual dielectric polarization values of the reference memory cells RFMCs connected to the bit lines /BLs recover to values which are values thereof before the infrared reflow, by executing a read operation on the dummy memory cells DMCs. Namely, the depolarization of the reference memory cells RFMCs is recovered.

Then, the system selects the word lines RFWLB and RWLT to carry out the read operation (key data read) on the real memory cells RMCs connected to the bit lines BLs (refer to (b) of FIG. 3). In other words, the first read operation is carried out as the read operation for a second time after power-on, to read 8-bit data ("2B" of a hexadecimal digit in this example). The depolarization of the reference memory cells RFMCs recovers before key data is read. Therefore, key data is normally read out.

Carrying out the second and first read operation successively eliminates the necessity for the user (system) of the ferroelectric memory to distinguish the read operation on the dummy memory cells DMCs from that on the real memory cells RMCs. To be more specific, the access specifications to the ROM area RO in the ferroelectric memory may be defined that effective data is read out in the second or subsequent read operation, and the user is not informed of the presence of the dummy memory cells DMCs.

Then, the system selects the word lines RFWLT and DWLB to carry out the read operation (dummy read and second read operation) on the dummy memory cells DMCs connected to the bit lines /BLs (refer to (c) of FIG. 3). 8-bit undefined data is read by the dummy read. The residual dielectric polarization values of the reference memory cells RFMCs connected to the bit lines BLs return to values which are values thereof before the infrared reflow. Namely, the depolarization of the reference memory cells RFMCs is recovered.

Then, the system selects the word lines RFWLT and RWLB to carry out the read operation (key data read and first read operation) on the real memory cells RMCs connected to the bit lines /BLs (refer to (d) of FIG. 3). 8-bit data ("5A" of a hexadecimal digit in this example) is read by the key data read. The depolarization of the reference memory cells RFMCs recovers before key data is read. Therefore, key data is normally read out.

After normal key data read, the RAM area RA is accessed.

Figure 4:
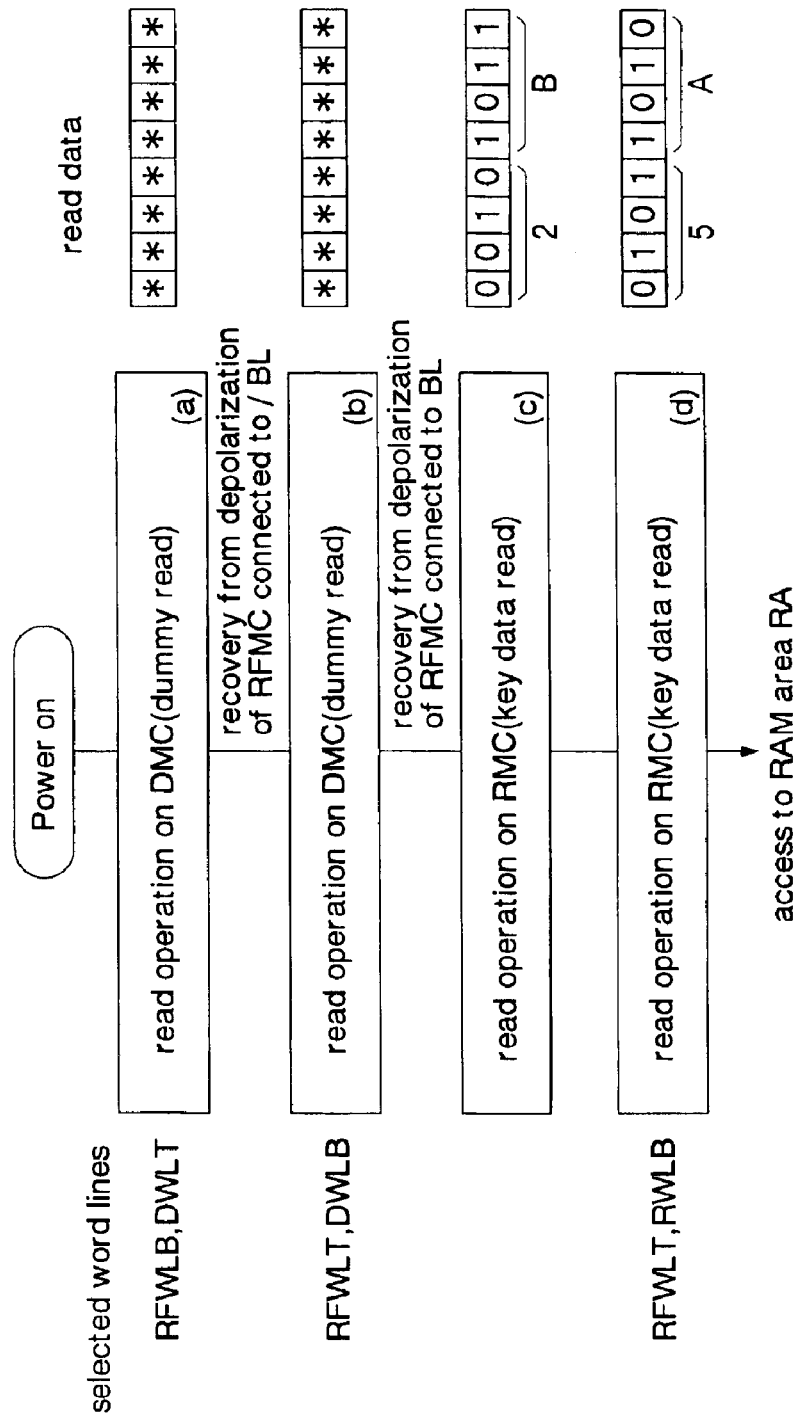
FIG. 4 is a flow chart showing the other operation of the ferroelectric memory according to the first embodiment.

FIG. 4 shows another operation of the ferroelectric memory according to the first embodiment.

In this example, the dummy reads (second read operation) are carried out on the reference memory cells RFMCs connected to the bit lines /BLs and BLs, respectively, in order to recover the depolarization of the reference memory cells RFMCs (refer to (a) and (b) of FIG. 4). Then, the key data reads (first read operation) are carried out on the real memory cells RMCs connected to the bit lines BLs and /BLs, respectively (refer to (c) and (d) of FIG. 4).

In this embodiment, the flowchart in FIG. 4 is the same as that in FIG. 3 except that the sequence of the operations (b) and (c) is changed between FIG. 4 and FIG. 3.

Figure 5:
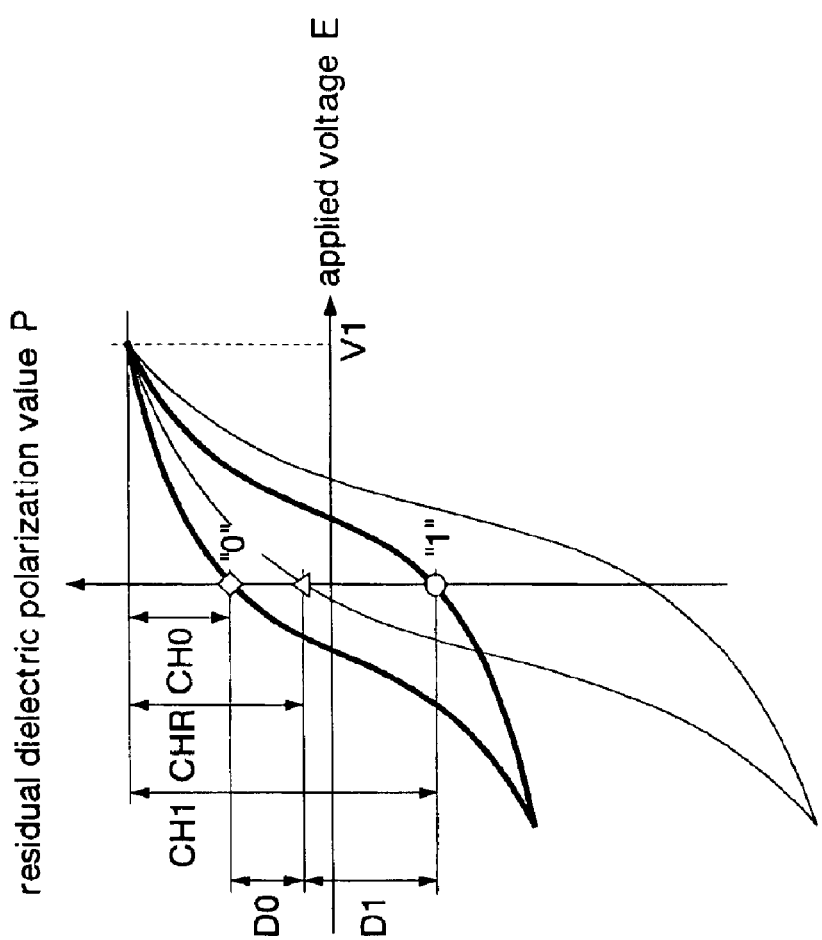
FIG. 5 is a graph showing characteristic curves of the residual dielectric polarization of the ferroelectric capacitor in the ROM area RO after manufacturing the ferroelectric memory.

FIG. 5 shows characteristic curves of the residual dielectric polarization of the ferroelectric capacitors in the ROM area RO after manufacturing the ferroelectric memory.

In the drawing, a hysteresis loop illustrated in thick lines shows a characteristic of the ferroelectric capacitor in the real memory cell RMC. A hysteresis loop illustrated in narrow lines shows a characteristic of the ferroelectric capacitor in the reference memory cell RFMC. The size of the ferroelectric capacitor in the reference memory cell RFMC is 1.5 times as large as that of the ferroelectric capacitor in the real memory cell RMC. Therefore, the hysteresis loop enlarges by 1.5 times in the direction of a Y-axis.

A rhombus, a circle, and a triangle on the hysteresis loops indicate the residual dielectric polarization values of logic "0" and logic "1" stored in the real memory cell RMC, and the residual dielectric polarization value of reference data (corresponding to logic "0") stored in the reference memory cell RFMC, respectively.

In the read operation, a voltage applied between both ends of the ferroelectric capacitor is set at a voltage V1, regardless of a type of memory cells to be read. Thus, electric charge CH0, CH1, and CHR is generated in accordance with the residual dielectric polarization of the logic "0" and logic "1" stored in the real memory cell RMC, and of the reference data stored in the reference memory cell RFMC. Voltage of the bit line BL or /BL varies according to amounts of the electric charge CH0, CH1, and CHR. The sense amplifier amplifies the difference in voltages between the bit lines BL and /BL, which corresponds to the difference D0 between the electric charge CH0 and CHR, or the difference D1 between the electric charge CH1 and CHR, to read data from the real memory cell RMC.

The ferroelectric capacitor in the reference memory cell RFMC is designed to have a residual dielectric polarization value such that the difference D1 becomes larger than the difference D0. This is because the read margin of the logic "1" of the real memory cell RMC is increased, which is opposite to the logic of the reference memory cell RFMC, in consideration of the variations in the characteristics of the ferroelectric capacitors due to the changes in a manufacturing condition and the like.

Figure 6:
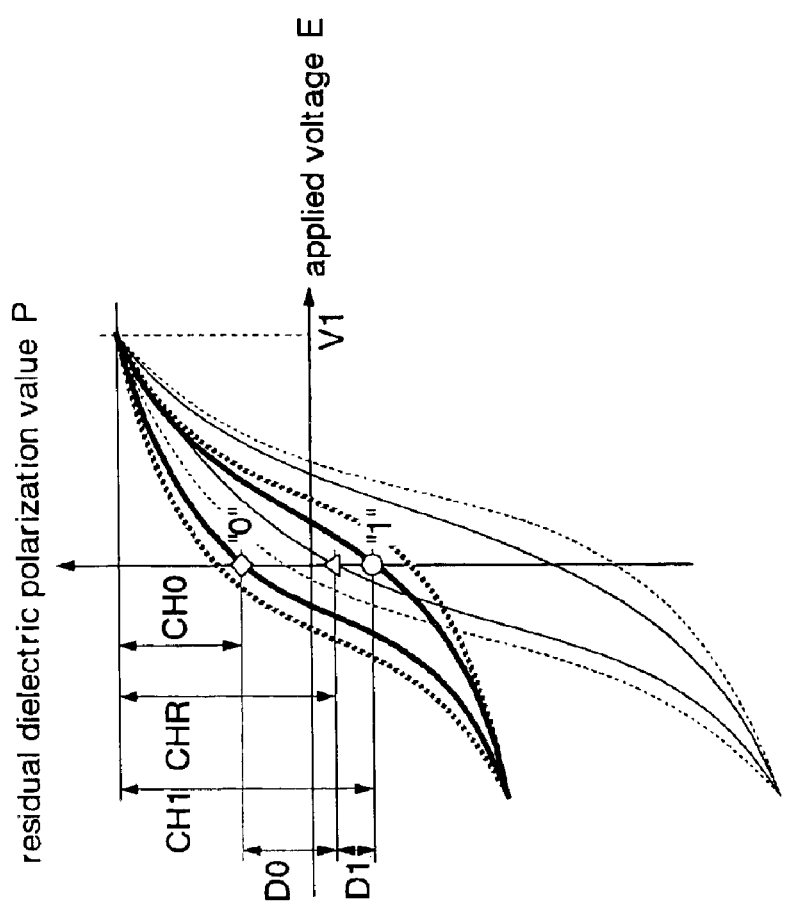
FIG. 6 is a graph showing characteristic curves of the residual dielectric polarization of the ferroelectric capacitor in the ROM area RO after assembling the ferroelectric memory.

FIG. 6 shows characteristic curves of the residual dielectric polarization of the ferroelectric capacitors in the ROM area RO after assembling the ferroelectric memory. In the drawing, broken lines show characteristics of the ferroelectric capacitors after manufacturing the ferroelectric memory shown in FIG. 5.

The infrared reflow in the assembly process depolarizes the ferroelectric capacitors. As a result, the difference D1 between the electric charge CH1 corresponding to the logic "1" stored in the real memory cell RMC, and the electric charge CHR corresponding to the reference data stored in the reference memory cell RFMC, becomes much smaller than the difference D0 between the electric charge CH0 corresponding to the logic "0" stored in the real memory cell RMC, and the electric charge CHR. The read operation of the logic "1" on the real memory cell RMC cannot be properly carried out in this condition because of the small read margin. In other words, the logic "1" stored in the real memory cell RMC is destroyed.

Figure 7:
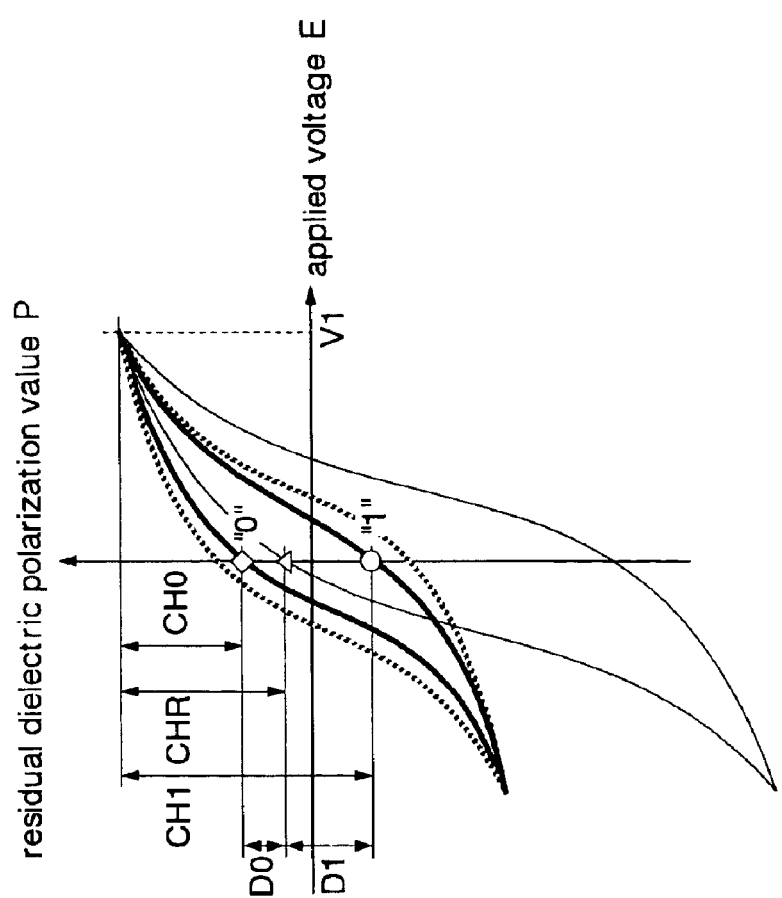
FIG. 7 is a graph showing characteristic curves of the residual dielectric polarization of the ferroelectric capacitor in the ROM area RO after dummy read of the ferroelectric memory.

FIG. 7 shows characteristic curves of the residual dielectric polarization of the ferroelectric capacitors in the ROM area RO after the dummy read on the ferroelectric memory.

The residual dielectric polarization value of the ferroelectric capacitor in the reference memory cell RFMC returns, by the dummy read from the dummy memory cell DMC, to a value which is a value after the ferroelectric memory is manufactured (refer to FIG. 5). As a result, the difference D1 between the electric charge CH1 corresponding to the logic "1" stored in the real memory cell RMC, and the electric charge CHR corresponding to the reference data stored in the reference memory cell RFMC, becomes larger than the difference D0 between the electric charge CH0 corresponding to the logic "0" stored in the real memory cell RMC and the electric charge CHR. The read operation of the logic "1" on the real memory cell RMC is properly carried out because of the large read margin of the logic "1".

The difference D0 between the electric charge CH0 corresponding to the logic "0" stored in the real memory cell RMC, and the electric charge CHR corresponding to reference data stored in the reference memory cell RFMC, becomes smaller than that after the manufacture of the ferroelectric memory. The reference memory cell RFMC, however, stores the logic "0", so that the variation in the difference D0 is small. Therefore, the read operation of the logic "0" from the real memory cell RMC can properly be carried out too.

Figure 8:
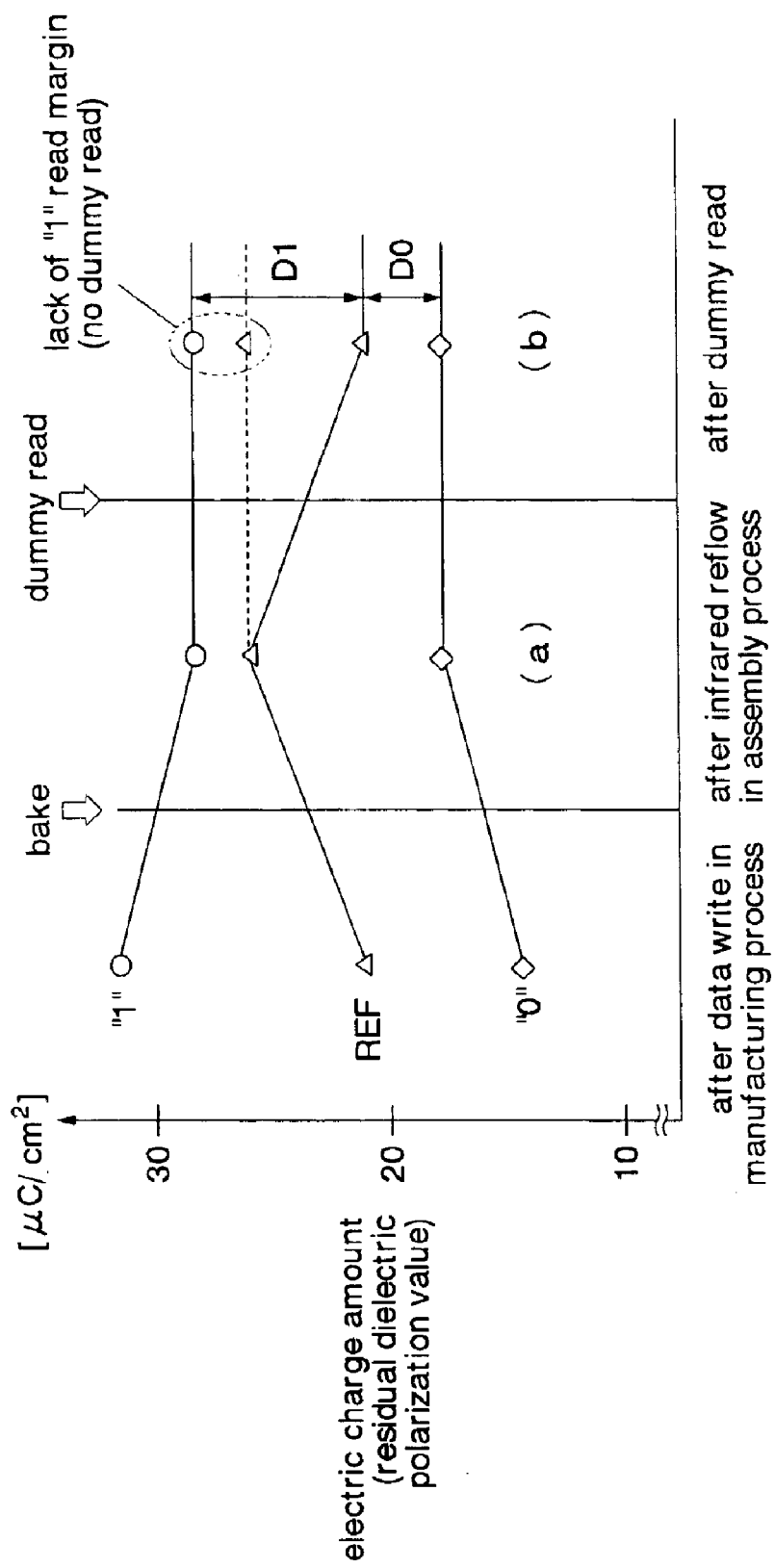
FIG. 8 is a graph of experimental data showing variation in a read margin.

FIG. 8 shows variation (experimental values) in a read margin of the ferroelectric memory.

In this experiment, the ferroelectric memory is baked at 250° C. on the assumption that the infrared reflow is performed in the assembly process. Because of the baking, the residual dielectric polarization value of the real memory cell RMC storing the logic "1" decreases. The residual dielectric polarization values of the real memory cell RMC storing the logic "0" and of the reference memory cell RFMC increase (refer to (a) of FIG. 8).

The dummy read decreases the residual dielectric polarization value of the reference memory cell RFMC. Then, it is possible to properly set the difference D1 between the residual dielectric polarization value of the logic "1" of the real memory cell RMC and that of the reference memory cell RFMC, and the difference D0 between the residual dielectric polarization value of the logic "0" of the real memory cell RMC and that of the reference memory cell RFMC (refer to (b) of FIG. 8). In other words, by the dummy read, the off-balanced large difference in the residual dielectric polarization values of the reference memory cell RFMC and of the real memory cell RMC, which is caused by the infrared reflow, returns to a mostly balanced difference which is a value after the manufacturing.

In the drawing, a broken line shows the characteristic of the reference memory cell RFMC without the dummy read. In this case, as described in FIG. 6, the difference between the residual dielectric polarization value of the logic "1" stored on the real memory cell RMC and that of the reference memory cell RFMC becomes small, so that the logic "1" cannot be read out.

In the first embodiment, as described above, the dummy read operation is carried out to access the reference memory cell RFMC in the ROM area RO before key data read. This enables the residual dielectric polarization value of the ferroelectric capacitor C1 in the reference memory cell RFMC, which has reduced by the infrared reflow (heat treatment) in the assembly process of the ferroelectric memory, to return to a normal value which is the value after the test process. Therefore, it is possible to properly carry out the subsequent read operation on the real memory cell RMC. Namely, forming the dummy memory cells DMCs in the ROM area RO makes it possible to always read key data written in the test process of the manufacturing process with properness.

Especially, adopting this invention makes it possible to easily add the security function to the ferroelectric memory. Only the single ferroelectric memory can have both functions as the ROM for storing key data and as the nonvolatile RAM for storing other data. Therefore, it is possible to provide the IC card and the like with the security function at low cost.

The size of the ferroelectric capacitor C1 of the reference memory cell RFMC in the ROM area RO is twice as large as that of the ferroelectric capacitor of the reference memory cell RFMC in the RAM area RA. Thus, the influence of the depolarization in the reference memory cell RFMC in the ROM area RO, due to the heat treatment in the assembly process of the ferroelectric memory, can be reduced at minimum. As a result, proper data can always be read from the real memory cell RMC in the ROM area RO.

Figure 9:
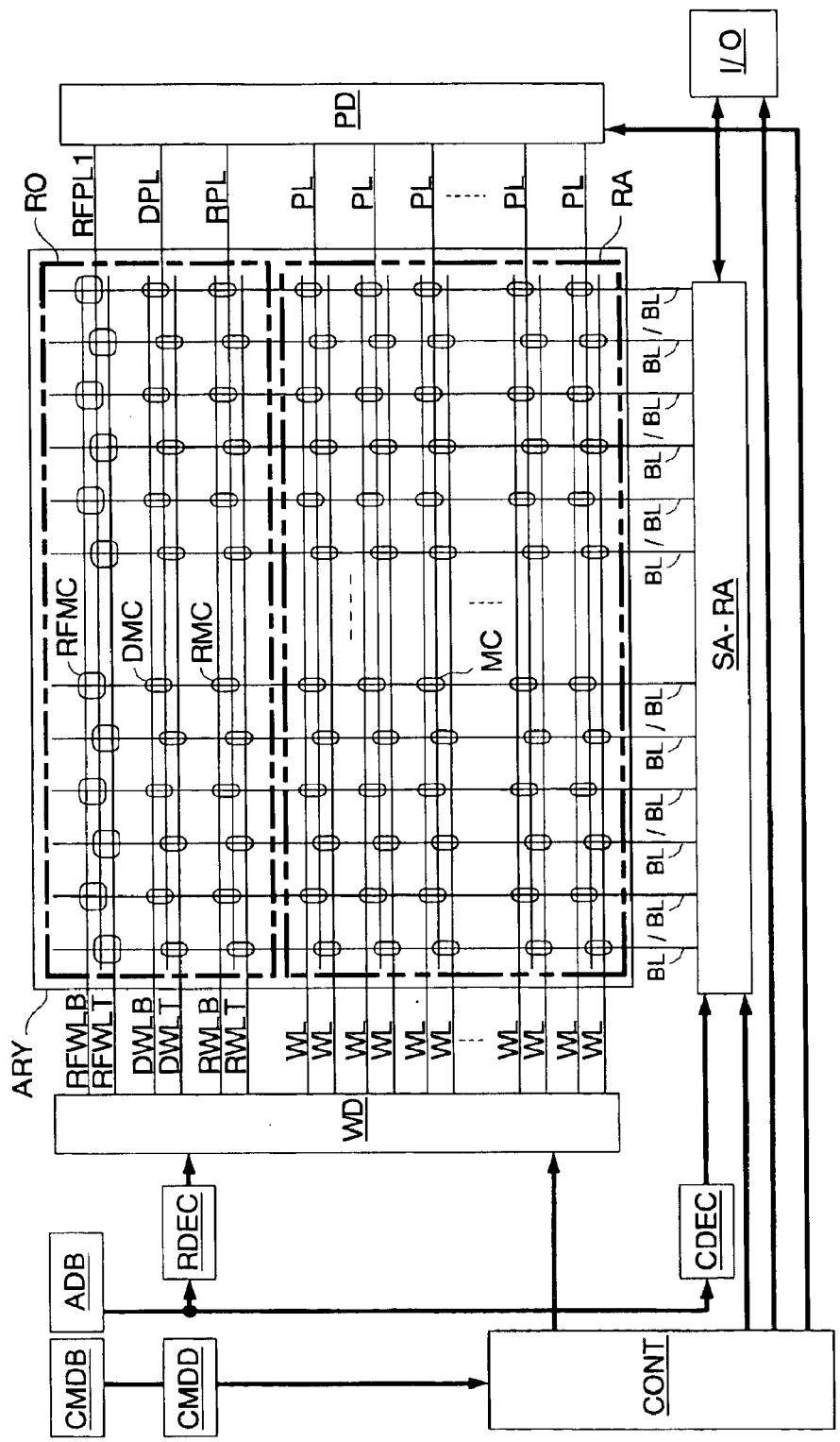
FIG. 9 is a block diagram showing a second embodiment of the present invention.

FIG. 9 shows a second embodiment of a ferroelectric memory and a method of reading data therein according to the present invention. The same elements as in the first embodiment are designated by the same reference numbers, and detailed description thereof is omitted.

In this embodiment, the reference memory cells RFMCs in the ROM area RO are used in the read operation of the RAM area RA. Namely, the reference memory cells RFMCs and the bit line pairs BLs and /BLs are common in both the ROM area RO and the RAM area RA. Since the bit line pairs BLs and /BLs are common, the sense amplifier row SA-RA is common in both the ROM area RO and the RAM area RA. Accordingly, the sense amplifier row SA-RO of the first embodiment is not provided in this embodiment. The rest of the structure is the same as that of the first embodiment.

The similar effect to the above first embodiment can be obtained in this embodiment. Furthermore, according to this embodiment, since the ROM area RO and the RAM area RA share the reference memory cells RFMCs, the size of the memory cell array ARY can be reduced. The size of the reference memory cell RFMC is larger than that of the real memory cell RMC, the dummy memory cell DMC, or the memory cell MC in the RAM area RA. Therefore, the size of the memory cell array ARY is effectively reduced. Sharing the reference memory cells RFMCs makes it possible to reduce the sense amplifier row and the chip size of the ferroelectric memory.

Figure 10:
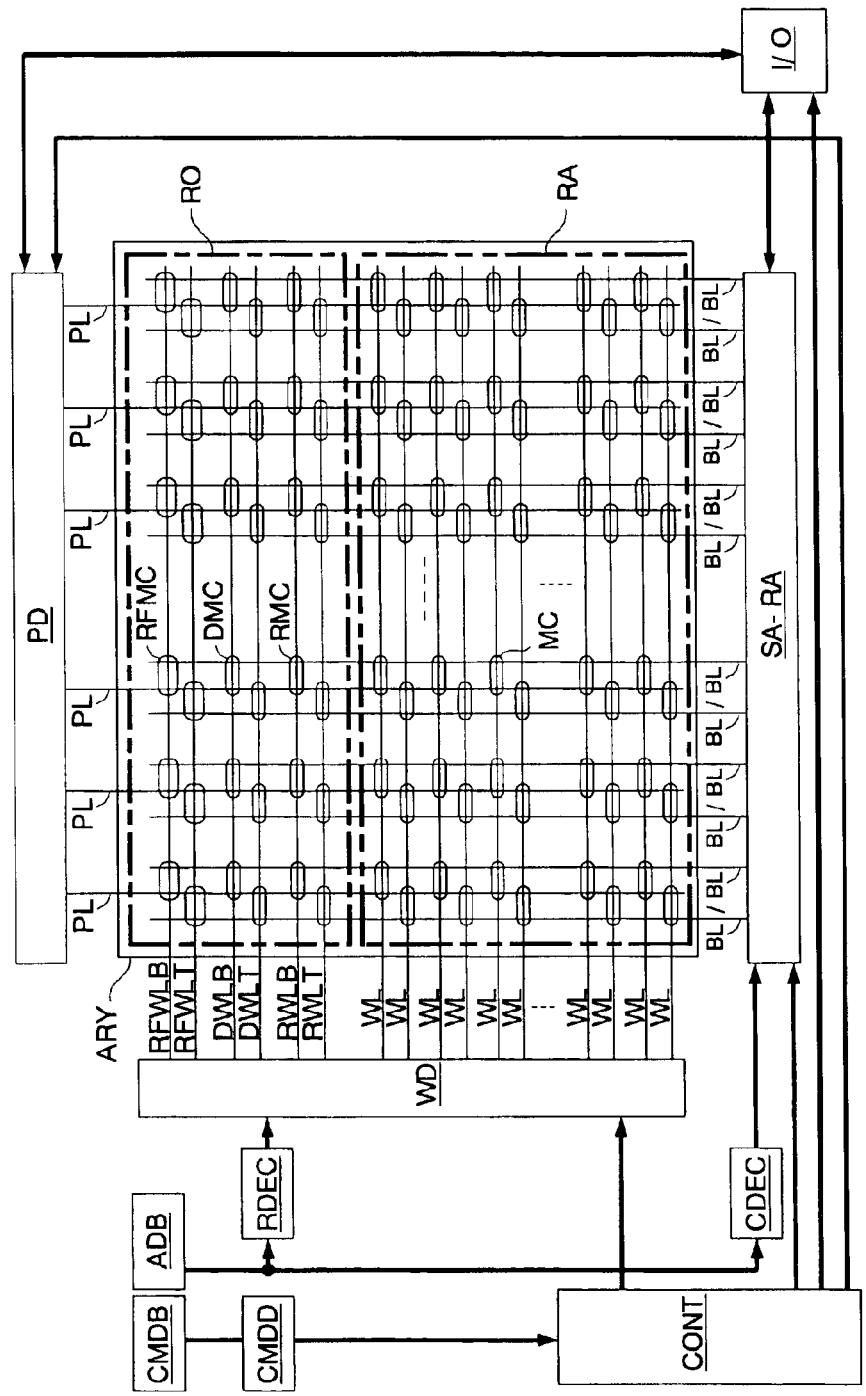
FIG. 10 is a block diagram showing a third embodiment of the present invention.

FIG. 10 shows a third embodiment of a ferroelectric memory and a method of reading data therein according to the present invention. The same elements as in the first embodiment are designated by the same reference numbers, and detailed description thereof is omitted.

In this embodiment, the plate lines PLs are wired orthogonally to the word lines RFWLB, RFWLT, DWLB, DWLT, RWLB, RWLT, and WLs. In other words, the ferroelectric memory according to the present invention adopts a word line/plate line cross technique. In the word line/plate line cross technique, it is possible to select only the plate line/lines connected to the memory cell/cells actually carrying out the read operation, in accordance with the selection of the word line. Thus, since the operation of drivers unnecessary for memory operation stops in the plate driver row PD, power consumption can be reduced. The plate driver row PD is opposed to the sense amplifier row SA-RA across the memory cell array ARY. The rest of the structure is almost the same as that of the second embodiment.

Figure 11:
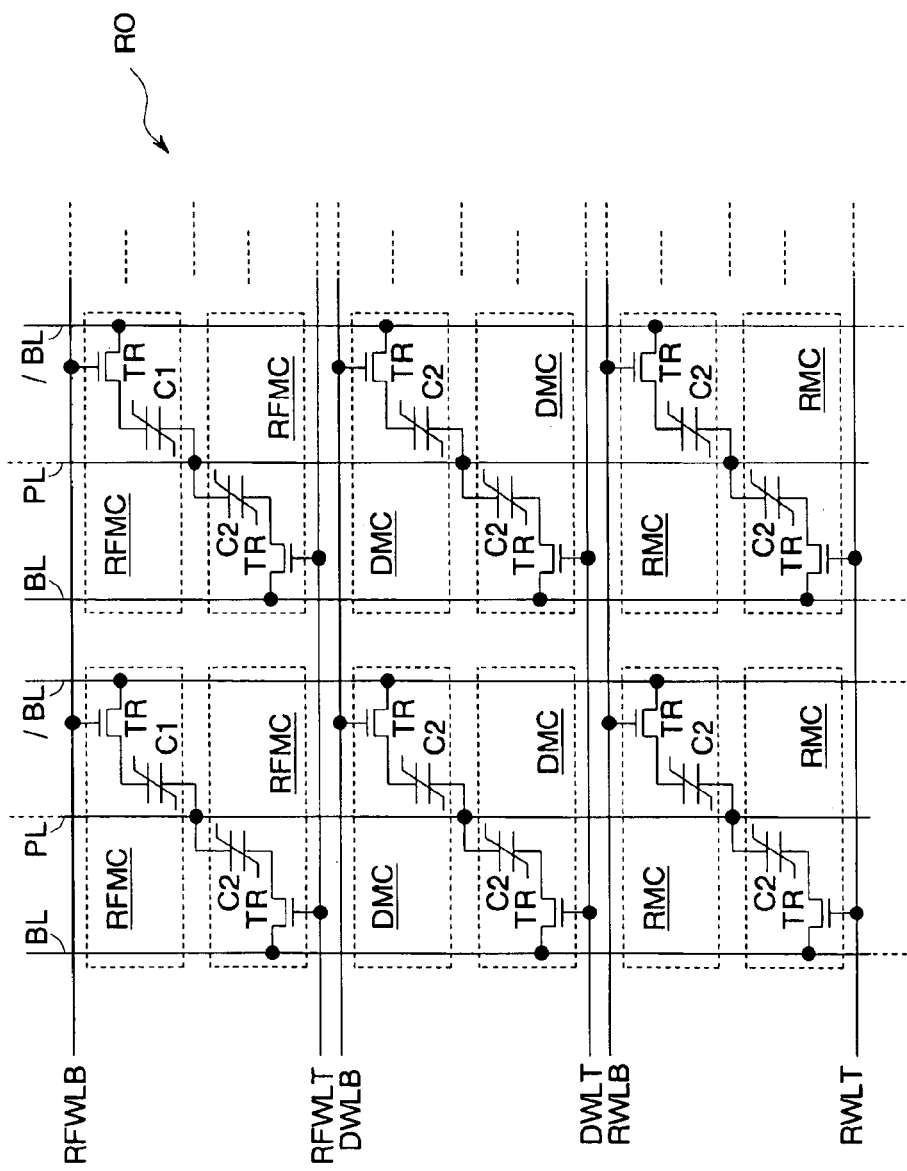
FIG. 11 is a block diagram showing the details of essential portions of a ROM area RO shown in FIG. 10.

FIG. 11 shows the details of essential portions of the ROM area RO shown in FIG. 10.

The ROM area RO is almost identical to that of FIG. 2, except that the plate lines PLs are wired orthogonally to the word lines RFWLB, RFWLT, DWLB, DWLT, RWLB, RWLT, and WLs.

In this embodiment, it is possible to obtain the same effect as the above first and second embodiments.

Figure 12:
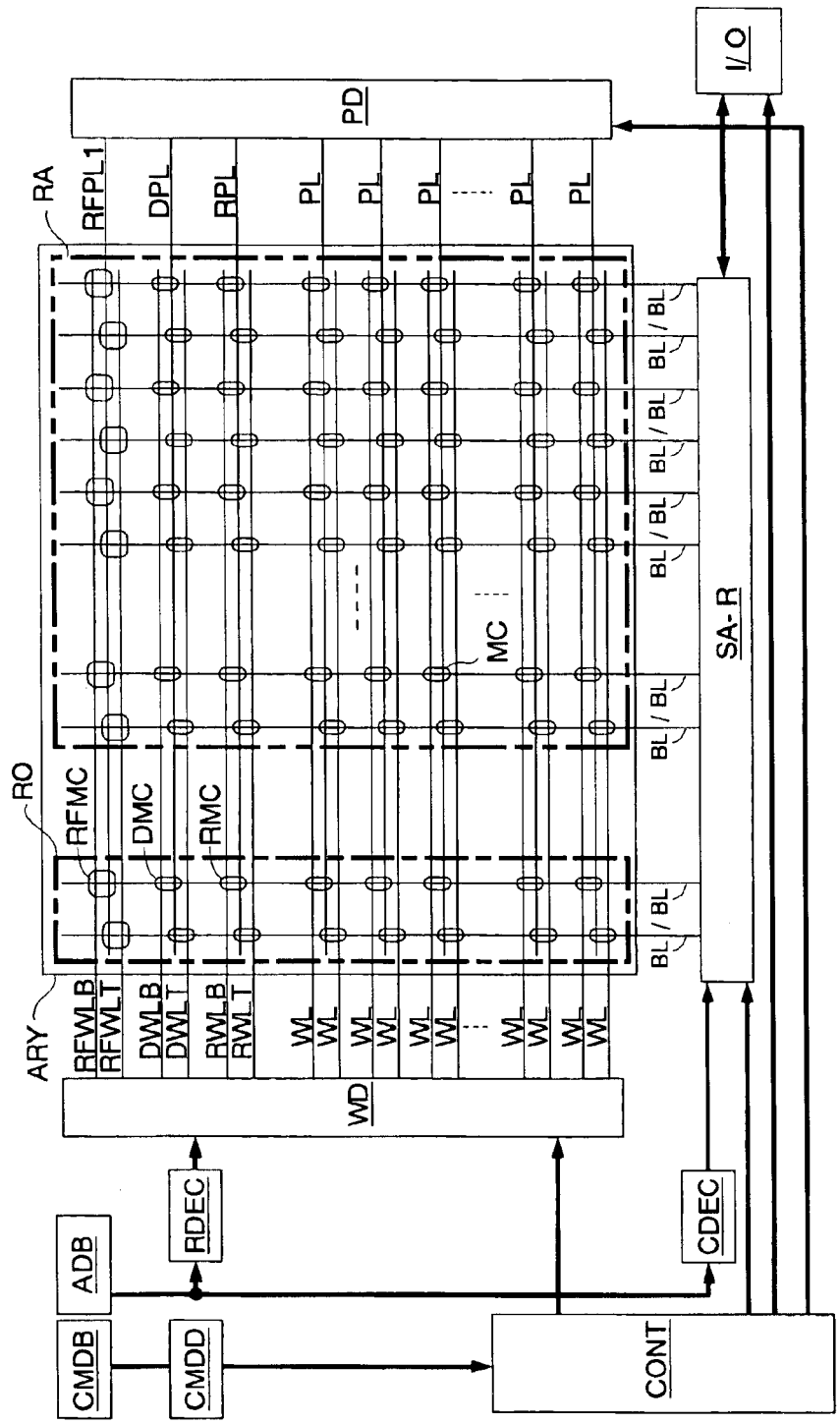
FIG. 12 is a block diagram showing a fourth embodiment of the present invention.

FIG. 12 shows a fourth embodiment of a ferroelectric memory and a method of reading data therein according to the present invention. The same elements as in the first embodiment are designated by the same reference numbers, and detailed description thereof is omitted.

In this embodiment, the ROM area RO and the RAM area RA are disposed in a wiring direction of the word lines RFWLB, RFWLT, DWLB, DWLT, RWLB, RWLT, and WLs. The ROM area RO and the RAM area RA share the word lines RFWLB, RFWLT, DWLB, DWLT, RWLB, RWLT, and WLs. The ferroelectric memory is almost identical to that of the foregoing second embodiment, except for the memory cell array ARY.

The ROM area RO is constructed of the memory cells RFMCs, DMCs, and RMCs connected to a pair of bit lines BL and /BL. The real memory cells RMCs are connected to the different word lines RWLB, RWLT, and WLs. When reading key data from the real memory cells RMCs connected to the bit line BL, the bit line BL functions as the first bit line, and the bit line /BL functions as the second bit line.

Since the real memory cells RMCs are connected to the common bit line BL or /BL, key data written into the real memory cells RMCs is read out by selecting the word lines successively. Namely, key data is serially read out from the ROM area RO in the ferroelectric memory according to this embodiment.

In this embodiment, the same effect as the foregoing first and the second embodiments is obtained.

The invention is not limited to the above embodiments and various modifications may be made without departing from the spirit and scope of the invention. Any improvement may be made in part or all of the components.

What is claimed is:

1. A ferroelectric memory comprising a ROM area and a RAM area both including memory cells each having a ferroelectric capacitor, wherein said ROM area comprises:

at least one real memory cell for storing data to be written in manufacturing process of said ferroelectric memory;

a dummy memory cell;

a reference memory cell having a ferroelectric capacitor therein whose residual dielectric polarization value is set to a predetermined value in the manufacturing process;

a first bit line connected to said real memory cell and said dummy memory cell, and transferring therethrough an electric charge corresponding to a residual dielectric polarization value of the ferroelectric capacitor which is included in a selected one of said real memory cell and dummy memory cell;

a second bit line connected to said reference memory cell, and transferring therethrough an electric charge corresponding to a residual dielectric polarization value of the ferroelectric capacitor which is included in said reference memory cell being selected in synchronization with a selection of said real memory cell or said dummy memory cell; and a sense amplifier connected to said first and second bit lines, for amplifying a difference in voltage between said first and second bit lines, the difference occurring due to the transferred electric charges.

2. The ferroelectric memory according to claim 1, wherein said first bit line connects a plurality of real memory cells.

3. The ferroelectric memory according to claim 1, further comprising:

first, second, and third word lines connected to said real memory cell, said dummy memory cell, and said reference memory cell, respectively, to select said real memory cell, said dummy memory cell, and said reference memory cell; and first, second, and third plate lines connected to said real memory cell, said dummy memory cell, and said reference memory cell, respectively, wherein said first to third word lines and said first to third plate lines are wired in a same direction.

4. The ferroelectric memory according to claim 1, further comprising:

first, second, and third word lines connected to said real memory cell, said dummy memory cell, and said reference memory cell, respectively, to select said real memory cell, said dummy memory cell, and said reference memory cell; and first, second, and third plate lines connected to said real memory cell, said dummy memory cell, and said reference memory cell, respectively, wherein said first to third word lines are wired orthogonally to said first to third plate lines.

5. The ferroelectric memory according to claim 1, wherein said RAM area comprises:

normal memory cells for reading data therefrom and writing data thereto; and a reference memory cell used in accessing said normal memory cells, wherein a size of said ferroelectric capacitor of said reference memory cell in said ROM area is larger than a size of a ferroelectric capacitor of said reference memory cell in said RAM area.

6. The ferroelectric memory according to claim 1, wherein the data written into said real memory cell in advance is authentication data.

7. The ferroelectric memory according to claim 6, wherein said authentication data is key data used in the Public Key Infrastructure.

8. A method of reading data in a ferroelectric memory comprising a ROM area and a RAM area both including memory cells each having a ferroelectric capacitor, said ROM area comprising: a first bit line connected to a dummy memory cell and a real memory cell, said real memory cell storing therein data to be written in manufacturing process; a second bit line connected to a reference memory cell having a ferroelectric capacitor which is included in reference memory cell whose residual dielectric polarization value is set to a predetermined value in the manufacturing process; and a sense amplifier connected to said first and second bit lines, for amplifying a difference in voltage between said first and second bit lines, said difference occurring due to the transferred electric charges, the method comprising the step of:

executing, prior to a first read operation for reading real data from said real memory cell, a second read operation for reading dummy data from said dummy memory cell.

9. The method of reading data in a ferroelectric memory according to claim 8, wherein: said first read operation comprises the steps of selecting said real memory cell and said reference memory cell, transferring electric charges corresponding to residual dielectric polarization values of said real memory cell and of said reference memory cell to said first and second bit lines, respectively, and operating said sense amplifier; and said second read operation comprises the steps of selecting said dummy memory cell and said reference memory cell, transferring electric charges corresponding to residual dielectric polarization values of said dummy memory cell and of said reference memory cell to said first and second bit lines, respectively, and operating said sense amplifier.

10. The method of reading data in a ferroelectric memory according to claim 8, further comprising the steps of:

executing said second read operation as an initial read operation after power-on of said ferroelectric memory; and executing said first read operation as at least one of second and subsequent read operations.

11. The method of reading data in a ferroelectric memory according to claim 10, further comprising the step of:

successively executing said second read operation and said first read operation after the power-on.

12. The method of reading data in a ferroelectric memory according to claim 8, wherein the data written into said real memory cell in advance is authentication data.

13. The method of reading data in a ferroelectric memory according to claim 12, wherein said authentication data is key data used in the Public Key Infrastructure.

* * * * *